(12) United States Patent
Hori (10) Patent No.: US 7,514,376 B2
(45) Date of Patent: Apr. 7, 2009

(54) MANUFACTURE OF SEMICONDUCTOR DEVICE HAVING NITRIDIZED INSULATING FILM

(75) Inventor: Mitsuaki Hori, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 274 days.

(21) Appl. No.: 11/107,781

(22) Filed: Apr. 18, 2005

(65) Prior Publication Data
US 2005/0181626 A1    Aug. 18, 2005

Related U.S. Application Data

(63) Continuation of application No. PCT/JP2004/006213, filed on Apr. 28, 2004.

(30) Foreign Application Priority Data

Apr. 30, 2003   (WO) ................. PCT/JP03/05561

(51) Int. Cl.
*H01L 21/31* (2006.01)
(52) U.S. Cl. .................. 438/792; 438/287; 438/775; 438/778; 257/E21.191; 257/E21.625; 257/E21.639
(58) Field of Classification Search .............. 438/513, 438/765, 776, 777; 257/E21.191, E21.302
See application file for complete search history.

(56) References Cited

U.S. PATENT DOCUMENTS

| | | | |
|---|---|---|---|
| 5,403,786 A * | 4/1995 | Hori ........................ | 438/585 |
| 6,197,701 B1 * | 3/2001 | Shue et al. .................. | 438/763 |
| 6,235,590 B1 | 5/2001 | Daniel et al. | |
| 6,342,437 B1 * | 1/2002 | Moore ....................... | 438/474 |
| 6,391,796 B1 * | 5/2002 | Akiyama et al. ........... | 438/763 |
| 6,498,365 B1 | 12/2002 | Wakamiya | |
| 6,555,485 B1 | 4/2003 | Liu et al. | |

(Continued)

FOREIGN PATENT DOCUMENTS

CN    1402307 A    3/2003

(Continued)

OTHER PUBLICATIONS

Chuan H. Liu et al., Extending the Reliability Scaling Limit of Gate Dielectrics through Remote Plasma . . . , 2002 IEEE International Reliability Physics Symposium Proceedings 40th Annual, pp. 268-271.

(Continued)

*Primary Examiner*—Walter L Lindsay, Jr.
*Assistant Examiner*—Cheung Lee
(74) *Attorney, Agent, or Firm*—Westerman, Hattori, Daniels & Adrian, LLP.

(57) ABSTRACT

A method for manufacturing a semiconductor device is disclosed which enables to suppress decrease in the mobility in a channel region by suppressing piercing of boron through a gate insulation film which boron is ion-implanted into a gate electrode. The method for manufacturing a semiconductor device includes: a step for forming a gate insulating layer on an active region of a semiconductor substrate; a step for introducing nitrogen through the front surface of the gate insulating layer using active nitrogen; and a step for conducting an annealing treatment in an NO gas atmosphere so that the nitrogen concentration distribution in the nitrogen-introduced gate insulating layer is high on the front surface side and low on the side of the interface with the semiconductor substrate.

11 Claims, 7 Drawing Sheets

U.S. PATENT DOCUMENTS

| | | | |
|---|---|---|---|
| 6,653,192 B1 * | 11/2003 | Ryoo | 438/275 |
| 6,737,362 B1 * | 5/2004 | Chen et al. | 438/776 |
| 2002/0076869 A1 * | 6/2002 | Hasegawa | 438/197 |
| 2002/0197886 A1 | 12/2002 | Niimi et al. | |
| 2003/0235962 A1 | 12/2003 | Ishikawa et al. | |

FOREIGN PATENT DOCUMENTS

| | | |
|---|---|---|
| JP | 2000-228522 | 8/2000 |
| JP | 2001-93903 | 4/2001 |
| JP | 2002-110674 | 4/2002 |
| JP | 2002-151684 | 5/2002 |
| JP | 2002-198531 | 7/2002 |
| JP | 2002-222941 | 8/2002 |
| JP | 2003-133550 | 5/2003 |
| JP | 2004-23008 | 1/2004 |

OTHER PUBLICATIONS

Chinese Office Action mailed Sep. 7, 2007, issued in corresponding Chinese Application No. 2004800009227.

* cited by examiner

| S6 | ▲ | OX(0.85nm)+DPN+RTO+RTA |
| S7 | ■ | OX(0.85nm)+DPN+RTNO+RTA |
| S8 | × | OX |

| S9 | OX(0.8nm)+DPN+RTO(1000C)+RTA(1050C) |
|---|---|
| S10 | OX(0.8nm)+DPN+RTNO(950C)+RTA(1050C) |

| S11 | OX(0.8nm) + DPN(500W) + RTO(1000°C) + RTA(1050°C) |
|---|---|
| S12 | OX(0.8nm) + DPN(500W) + RTNO(950°C) + RTA(1050°C) |
| S13 | OX(0.8nm) + DPN(500W) + RTO(1000°C) + RTNO(950°C) + RTA(1050°C) |

MANUFACTURE OF SEMICONDUCTOR DEVICE HAVING NITRIDIZED INSULATING FILM

CROSS REFERENCE TO RELATED APPLICATION

This application is a continuation application of PCT/JP2004/006213 filed on Apr. 28, 2004, which claims priority of PCT/JP03/05561 filed on Apr. 30, 2003, the entire contents of both of which are incorporated herein by reference.

BACKGROUND OF THE INVENTION

A) Field of the Invention

The present invention relates to a semiconductor device manufacture method, and more particularly a method for manufacturing a semiconductor device having a gate insulating film which contains nitrogen.

B) Description of the Related Art

In order to improve the integration degree and operation speed of a semiconductor integrated circuit device, MOSFETs as its constituent elements are made micro fine and gate insulating films are made thinner. A gate electrode on the gate insulating film is usually made of a polysilicon layer or a lamination of a polysilicon layer and a silicide layer. Impurity ions are usually implanted into the polysilicon layer at the same time when source/drain regions are formed. The gate electrode and source/drain regions of a surface channel type n-channel MOSFET are implanted with n-type impurities. The gate electrode and source/drain regions of a surface channel type p-channel MOSFET are implanted with p-type impurities.

As the gate insulating film becomes thin, there occurs the phenomenon that boron as p-type impurities implanted into the gate electrode of a surface channel type p-channel MOSFET pierces through the gate insulating film and reaches the channel region. As boron is implanted into the n-type channel region, not only the threshold value is changed but also the mobility is lowered.

It is known that introducing nitrogen into the gate insulating film is effective for suppressing piercing of boron through the gate insulating film. As a method of introducing nitrogen into a silicon oxide film, it is known to heat a silicon substrate by resistor heating or lamp heating in a nitridizing gas atmosphere such as $NH_3$ gas, NO gas and $N_2O$ gas. Another method is also known which introduces nitrogen at a higher concentration in the surface layer of a silicon oxide film by using nitrogen plasma.

Another phenomenon is also known. As a gate insulating film becomes thin, tunneling current flows between the gate electrode and channel region, increasing gate leak current. If a gate insulating film of silicon oxide is (partially) replaced with an insulating film having a higher dielectric constant, a physical film thickness can be made thicker and gate leak current can be suppressed while an inversion capacitance equivalent film thickness is suppressed thin. Silicon oxynitride has generally a higher dielectric constant than that of silicon oxide so that it is effective for thickening a physical film thickness while the inversion capacitance equivalent film thickness is suppressed thin.

Japanese Patent Laid-open Publication No. 2002-198531 proposes to introduce nitrogen into a gate insulating film of silicon oxide formed on a silicon substrate by a remote plasma nitridizing process, and the gate insulation film is oxidized and nitridized in an $N_2O$ atmosphere at 800° C. to 1100° C. to redistribute nitrogen and form the gate insulating film having a uniform nitrogen concentration. This Publication describes that a transistor of long life and high reliability can be formed by forming a gate insulating film having a uniform nitrogen concentration at 6 at % or higher, e.g., 8 at % or 10 at %.

The remote plasma nitridizing process is a nitridizing process in which nitrogen plasma is generated by microwaves or the like in a plasma generation chamber independently from a processing chamber in which a substrate is accommodated and into which active plasma is introduced.

It can be considered that annealing in an $N_2O$ atmosphere may dissolve a portion of $N_2O$ gas into $N_2$, $O_2$, NO and the like, posing the problem that an oxide film thickness increase amount and a nitrogen concentration increase amount are hard to be controlled uniformly in each wafer and in wafers.

Japanese Patent Laid-open Publication No. 2002-110674 proposes to introduce nitrogen more on a gate insulating film surface in order to reduce gate leak current, while a nitrogen concentration near at an Si substrate interface is suppressed low, because the mobility of a MOS transistor is lowered if nitrogen is introduced into a region near at the Si substrate interface. This Publication proposes to perform radical nitridation using nitrogen gas for a silicon oxynitride film introduced with nitrogen beforehand, to suppress a nitrogen flow to be diffused from the surface, to suppress an introduced amount of nitrogen into a region near at the Si substrate interface, and to raise a nitrogen concentration in the film surface layer.

SUMMARY OF THE INVENTION

An object of the present invention is to provide a method of manufacturing a semiconductor device having a thin gate insulating film and MOSFETs having excellent characteristics.

Another object of the present invention is to provide a method of manufacturing a semiconductor device capable of suppressing boron implanted into a gate electrode from being pierced through a gate insulating film and suppressing the mobility of a channel region from being lowered.

According to one aspect of the present invention, there is provided a semiconductor manufacturing method comprising steps of: forming a gate insulating layer on an active region of a semiconductor substrate; introducing nitrogen through a front surface side of the gate electrode insulating layer, by using active nitrogen; and thereafter subjecting the semiconductor substrate to an annealing process in an NO gas atmosphere.

DESCRIPTION OF THE PREFERRED EMBODIMENTS

Nitrogen introduced into a gate insulating film of silicon oxide is effective for preventing boron from piercing through the gate insulating film during boron ion implantation into a gate electrode. However, as the gate insulating film becomes thin, it is difficult to present boron ion piercing, and boron reaches the interface between the gate insulating film and silicon substrate. As boron enters the channel region, the mobility is lowered and the boron concentration at the interface is likely to become irregular.

By introducing active nitrogen generated by plasma into a silicon oxide film or silicon oxynitride film, a nitrogen concentration distribution can be obtained which has a peak on the insulating film surface or in the insulating film. By utilizing this plasma nitridizing, more nitrogen can be introduced while the nitrogen concentration at the interface with the substrate is suppressed. A high nitrogen concentration is effective for suppressing boron piercing.

By introducing more nitrogen, a dielectric constant of the insulating film can be increased. Thickening a physical film thickness while an inversion capacitance equivalent film thickness (Teff) is suppressed is effective for suppressing gate leak current.

By lowering the nitrogen concentration at the interface between the insulating film and silicon substrate, the mobility in the channel region can be prevented from being lowered, and the negative bias temperature instability (NBTI) characteristics can be prevented from being degraded. The NBTI characteristics are the deterioration characteristics when a temperature is raised under stress.

The technique of generating nitrogen plasma at a position away from a substrate and introducing active nitrogen into the substrate is called a damage-free process without damages of the substrate.

However, the present inventor suspects this damage-free and considers a possibility of some substrate damages even if active nitrogen generated by plasma is introduced into an insulating film on a silicon substrate placed away from the plasma. In order to remove the damages, a high temperature annealing process is expected to be more effective than the nitrogen introducing process. In this context, the present inventor has studied the influence by the annealing process.

FIGS. 1A to 1E are cross sectional views illustrating the processes of forming samples used by the experiments made by the present inventor.

Figure 1A:
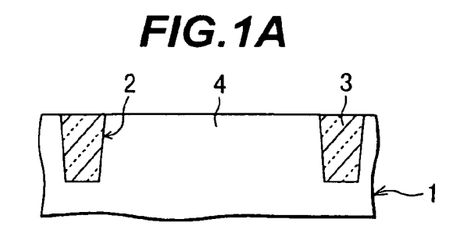
FIGS. 1A to 1F are cross sectional views and a graph illustrating the experiments made by the present inventor and their results.

As shown in FIG. 1A, a mask covering an active region 4 was formed on the surface of a silicon substrate 1. The silicon substrate 1 was subjected to anisotropic etching to form an element isolation trench 2. An insulating layer of silicon oxide or the like was deposited burying the element isolation trench 2, and an unnecessary insulating film on the surface of the silicon substrate was removed by chemical mechanical polishing (CMP) to form an element isolation region 3 having the insulating film buried in the trench, through shallow trench isolation (STI).

Figure 1B:
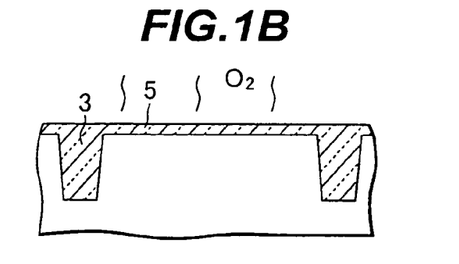

As shown in FIG. 1B, a gate oxide film 5 having a thickness of 1.0 nm was formed on the surface of an active region 4 of a silicon substrate 1, in an oxygen atmosphere at 965° C.

Figure 1C:
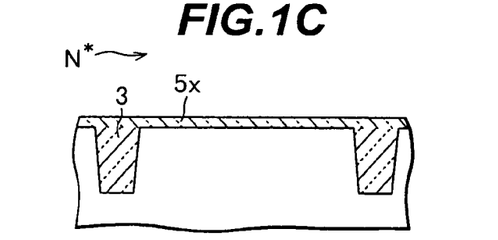

As shown in FIG. 1C, active nitrogen generated from nitrogen plasma excited by microwaves at 1.5 kW was introduced into the gate insulating film 5 in an atmosphere at 450° C. Active nitrogen was introduced into the surface layer of the silicon oxide gate insulating film and the film changed to a silicon oxynitride film 5x. For introducing active nitrogen, a remote plasma nitridizing system was used which is available from Applied Materials, Inc., Santa Clara, Calif., U.S.A.

Figure 7A:
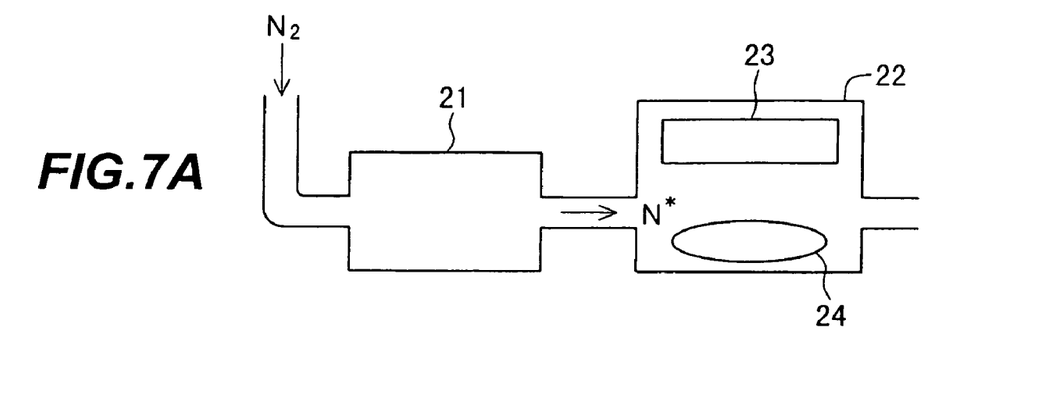
FIGS. 7A, 7B and 7C are schematic cross sectional views showing the structure of a remote plasma nitridizing system, a decoupled RF nitrogen plasma system and a gate insulating film using high-k material.

FIG. 7A is a schematic diagram showing the structure of a remote plasma nitridizing system. $N_2$ gas is introduced into a plasma generating chamber 21 to generate nitrogen plasma. Active nitrogen (radical) is generated from the nitrogen plasma and supplied to a reaction chamber 22. A lamp heating apparatus 23 having a number of lamps is equipped in the reaction chamber 2 so that a wafer 24 can be heated.

Figure 1D:
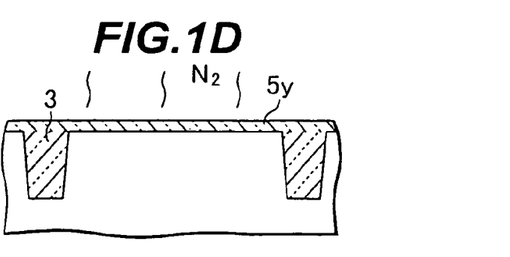

As shown in FIG. 1D, annealing was performed in a nitrogen atmosphere at 1050° C. to remove damages on the substrate caused by introduction of active nitrogen. With this annealing process, the silicon oxynitride film 5x changes to a silicon oxynitride film 5y.

Figure 1E:
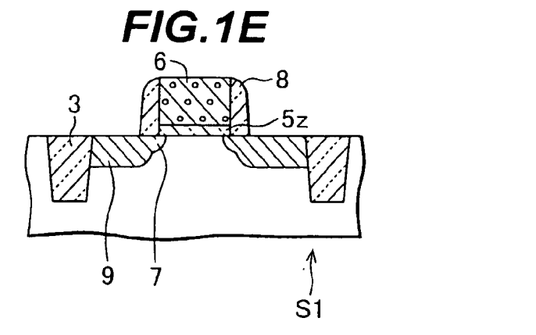

As shown in FIG. 1E, a polysilicon layer was deposited on the gate insulating film to a thickness of 100 nm by CVD and patterned by using a resist pattern to form a gate electrode having a gate length of about 0.5 μm to 1.0 μm. The gate insulating film 5y was also patterned to form a gate insulating film 5z.

After the gate electrode patterning, p-type impurity ions B were implanted to form extension regions 7. Thereafter, a silicon oxide film was deposited on the substrate to a thickness of about 60 nm by chemical vapor deposition (CVD), covering the gate electrode, and reactive ion etching was performed to remove the silicon oxide film on a flat surface and leave side wall spacers 8 only on the gate electrode side walls.

After the side wall spacers 8 were formed, p-type impurity ions B were further implanted to form high concentration source/drain regions 9. During this ion implanting processes, p-type impurity ions B were also implanted into the gate electrode 6. Thereafter, an interlayer insulating film was formed, openings for exposing the source/drain regions and gate electrode were formed through the interlayer insulating film, and electrodes were formed. With these processes, a sample S1 was obtained.

For comparison, a comparative sample S2 was also formed not by performing the annealing process shown in FIG. 1D after the active nitrogen introduction shown in FIG. 1C to form a MOSFET such as that shown in FIG. 1E.

Figure 1F:
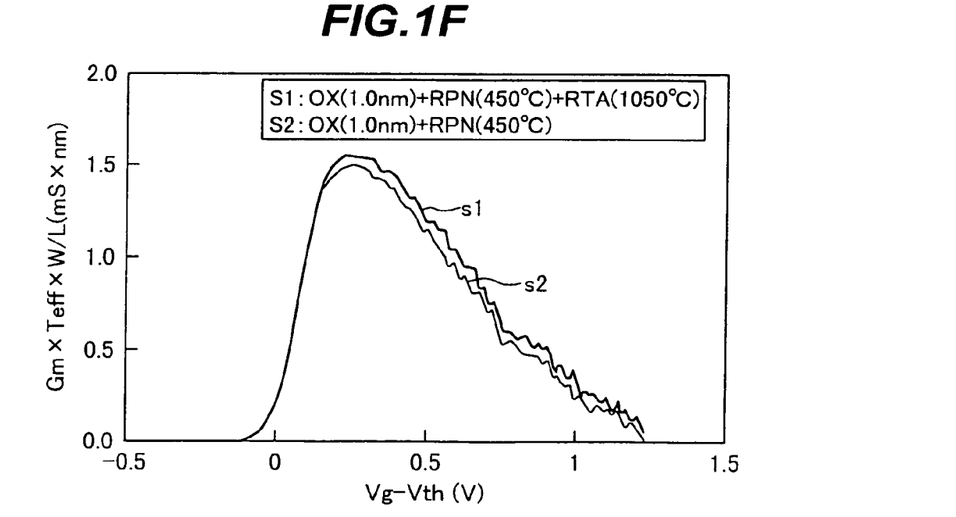

FIG. 1F is a graph showing the characteristics of two MOSFETs Si and S2. The abscissa represents Vg-Vth in the unit of V where Vg is a gate voltage and Vth is a threshold voltage. The ordinate represents a normalized mutual conductance in the unit of mS×nm, the normalized mutual conductance being obtained by multiplying a mutual conductance Gm by an inversion capacitance equivalent film thickness Teff and by a ratio W/L where W is a width of a channel region and L is a channel length. The mutual conductance is therefore normalized independently from the gate insulating film thickness and the channel region size.

The characteristics s1 of the sample S1 subjected to the annealing process in the nitrogen atmosphere at 1050° C. after the active nitrogen introduction show a higher mutual conductance generally over the whole area, than the characteristics s2 of the sample S2 not subjected to the annealing process in the nitrogen atmosphere. It is apparent that the annealing process improves the characteristics of MOSFET. This may be ascribed to that an improved carrier mobility improves a saturated current.

It has been found that the annealing process after the active nitrogen introduction improves the transistor characteristics. The present inventor has studied further on how the conditions of the annealing process change the transistor characteristics. Nitrogen ($N_2$), nitrogen monoxide (NO) and oxygen ($O_2$) were used for the atmosphere of the annealing process.

First, an element isolation region 3 was formed on a silicon substrate by a process similar to that shown in FIG. 1A. The silicon substrate surface was thermally oxidized in an $O_2$ atmosphere at 965° C. by a process similar to that shown in FIG. 1B to form a gate oxide film 5 having a thickness of 1.2 nm.

A nitridizing process similar to that shown in FIG. 1C was performed at a substrate temperature of 550° C. At the stage after nitrogen introduction, a thickness of the gate insulating film was 1.457 nm as measured with an ellipsometer meter.

Figure 2A:
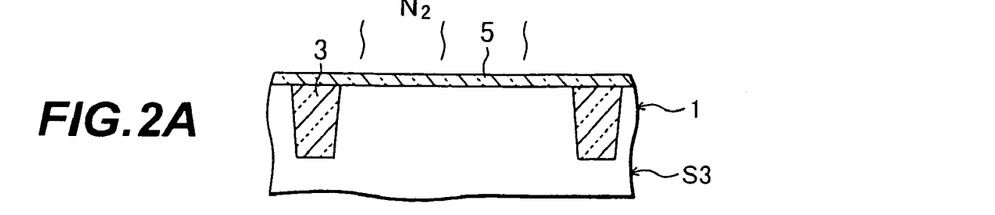
FIGS. 2A to 2D are cross sectional views and a graph illustrating the experiments made by the present inventor and their results.

As shown in FIG. 2A, for a third sample S3, an annealing process was performed after nitrogen introduction in a nitrogen atmosphere at 1050° C. This annealing process is a process in inert gas.

Figure 2B:
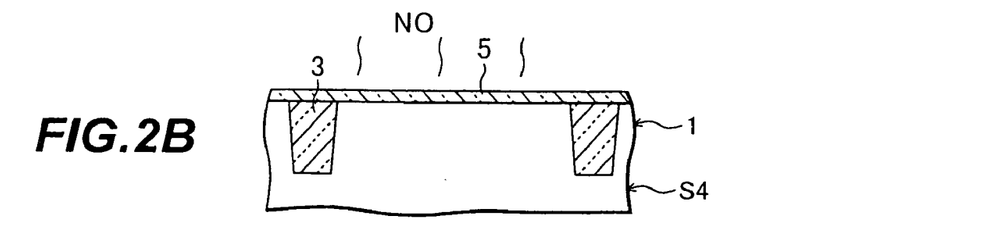

As shown in FIG. 2B, for a fourth sample S4, an annealing process was performed after nitrogen introduction in an NO atmosphere at 950° C. This annealing process is an oxidizing and nitridizing process. Thereafter, an annealing process was performed in a nitrogen atmosphere at 1050° C. At the stage after this annealing process, a thickness of the gate insulating film was 1.538 nm as measured with the ellipsometer meter. As compared to the third sample, the annealing process in NO is additionally used for the fourth sample. A film thickness increased by the annealing process in NO was 0.081 nm.

Figure 2C:
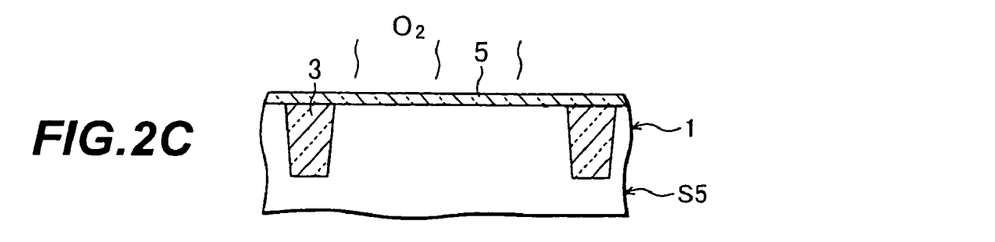

As shown in FIG. 2C, for a fifth sample S5, an annealing process was performed in an oxygen ($O_2$) atmosphere at 1000° C. after nitrogen introduction. This annealing process is an oxidizing process. Thereafter, an annealing process was performed in a nitrogen atmosphere at 1050° C. As compared to the third sample, the annealing process in $O_2$ is additionally used for the fifth sample.

Each annealing process was performed by rapid thermal annealing (RTA) in a very short time. Thereafter, insulated gate electrodes and source/drain regions were formed similar to the first and second samples.

Figure 2D:
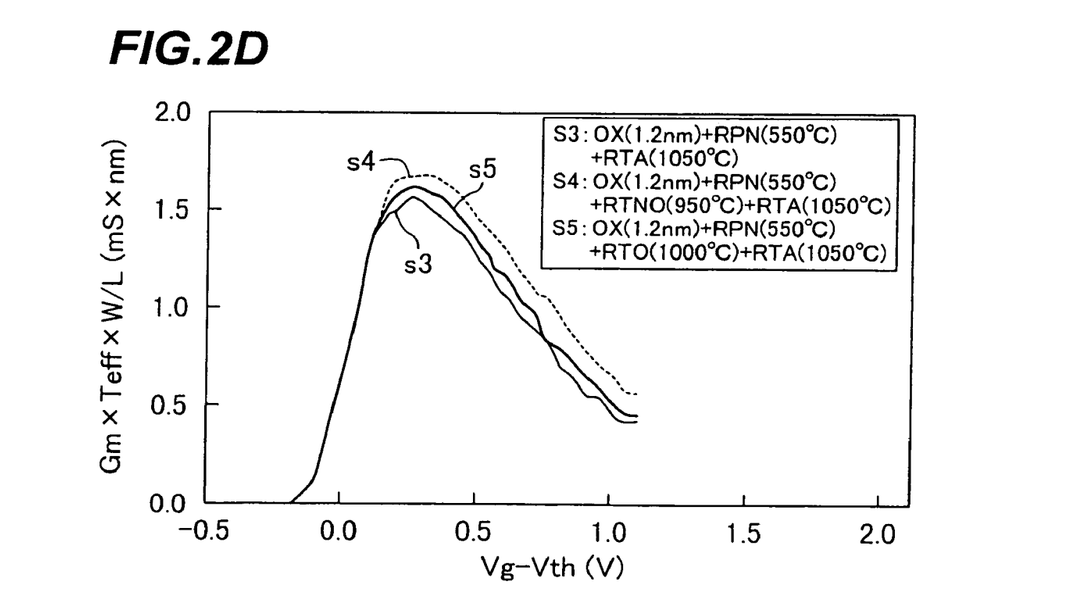

FIG. 2D is a graph showing the characteristics of the third, fourth and fifth samples fabricated in the above-described manner. The abscissa and ordinate are the same as those shown in FIG. 1F.

The characteristics s3 of the third sample S3 having a gate insulating film thickness and a temperature during active nitrogen introduction slightly different from those of the first sample S1, is generally the same as the characteristics s1 shown in FIG. 1F. Apparent improvements were made on the characteristics s4 of the sample S4 subjected to the (nitridizing and oxidizing) annealing process in the NO atmosphere at 950° C. after active nitrogen introduction. The intermediate characteristics between the characteristics s3 and s4 were given to the characteristics s5 of the sample S5 subjected to the (oxidizing) annealing process in the oxygen atmosphere at 1000° C. after active nitrogen introduction.

Summarizing these results, it is apparent that the annealing process after active nitrogen introduction improves the mutual conductance. Although the mutual conductance is improved by the annealing process in the oxygen atmosphere, more than the annealing process in the nitrogen atmosphere, the mutual conductance becomes highest by the nitridizing and oxidizing annealing process in the NO atmosphere.

The present inventor ascribes this to that the annealing in the NO atmosphere efficiently forms silicon-oxygen-nitrogen (Si—O—N) couplings near at the interface on the substrate side.

The annealing process in the oxidizing atmosphere or the nitridizing and oxidizing atmosphere oxidizes or nitridizes and oxidizes the substrate and makes the gate insulating film thick. In forming a transistor having an effective gate insulating film thickness of 2 nm or thinner, it is expected that the annealing process in the NO atmosphere providing a smaller film thickness increase is more preferable. It is preferable to set an insulating film thickness increase by the annealing process in the NO gas atmosphere to 0.2 nm or thinner. It is preferable that if a gate insulating film having a thickness of 1.7 nm or thinner is to be formed, an initial oxide film thickness is set to 1.5 nm or thinner.

As described with the prior art, it has been proposed to introduce active nitrogen (radical) into a silicon oxynitride film. The present inventor measured a time dependent dielectric breakdown (TDDB), which is one of reliability evaluation methods, for semiconductor devices having gate insulating films formed by the following two manufacture methods. The manufacture methods (1) and (2) have the same process conditions, although the order is different among processes of formation of oxide film, introducing active nitrogen into an oxide film, NO thermal treatment, and $N_2$ thermal treatment.

(1) A gate insulating film was formed by forming a thermally oxidized film, performing heat treatment in an NO gas atmosphere, introducing nitrogen by using active nitrogen, and performing heat treatment in an $N_2$ gas atmosphere, in this order.

(2) A gate insulating film was formed by forming a thermally oxidized film, introducing nitrogen by using active nitrogen, performing heat treatment in an NO gas atmosphere, and performing heat treatment in an $N_2$ gas atmosphere, in this order.

The manufacture yield of samples having the breakdown judgement criterion or lower after stress is applied in the TDDB measurements had a large difference, 0% for the samples (1) and 88% for the samples (2).

Namely, there is a large reliability difference although both the samples (1) and (2) have generally the same nitrogen distribution in the insulating films. The present inventor ascribes this to that heat treatment in the NO atmosphere after the active nitrogen introduction process efficiently forms silicon-oxygen-nitrogen (Si—O—N) couplings near at the interface with the substrate.

After annealing in the NO gas atmosphere, the heat treatment in the $N_2$ gas atmosphere at a higher temperature is performed to improve the NBTI characteristics, and is not an essential process.

As a plasma nitridizing system, in addition to the remote plasma nitridizing system, a decoupled RF nitrogen plasma system is also known which is available also from Applied Materials, Inc., Santa Clara, Calif., U.S.A.

Figure 7B:
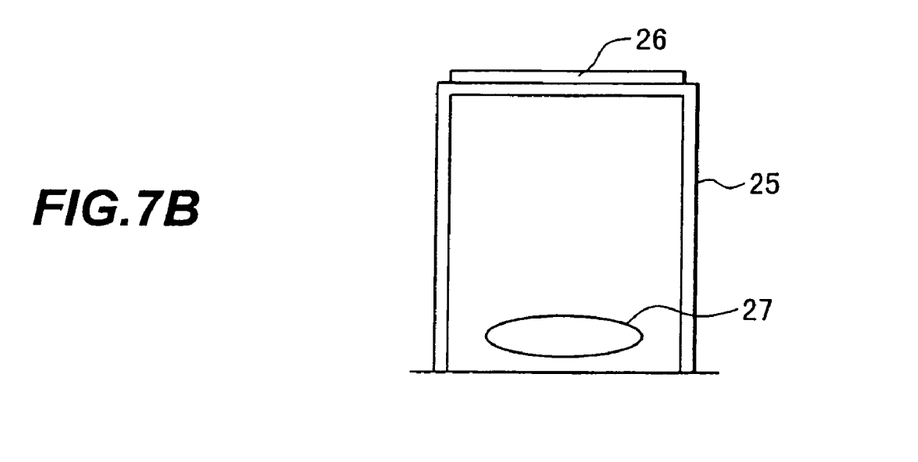

FIG. 7B is a schematic diagram showing the structure of a decoupled RF nitrogen plasma system. In this system, nitrogen plasma is generated through RF excitation by a coil 26 mounted on the top of a reaction chamber 25 which accommodates a sample 27 at the lower position. The nitrogen plasma is generated only in a space remote from the sample 27 and along the upper wall. This system is described hereinafter in an abbreviated term DPN.

Two types of samples were formed by using the DPN nitridizing system.

Figure 3A:
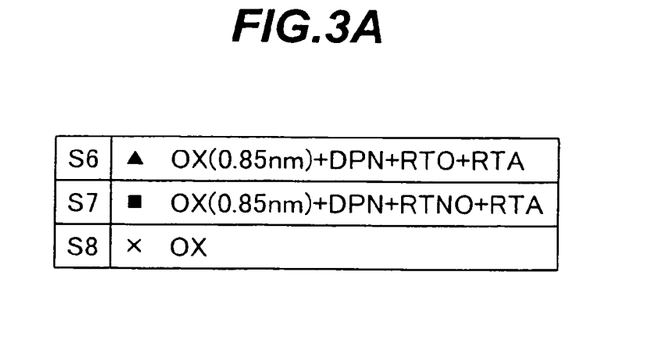
FIGS. 3A and 3B are a table and a graph illustrating the other experiments made by the present inventor and their results.

FIG. 3A shows the conditions under which two types of samples S6 and S7 and comparative samples S8 are formed.

First, a silicon oxide film having a thickness of 0.85 nm was formed by using a lamp annealing apparatus in an oxygen atmosphere at 900° C., by a process similar to the processes shown in FIGS. 1A and 1B. Thereafter, nitrogen plasma was excited in the DPN system at an RF power of 700 W, and active nitrogen was introduced in a room temperature atmosphere into the silicon oxide film on the substrate placed at the lower position.

For the sixth sample S6, after the active nitrogen is introduced, an oxidizing annealing process (RTO) was performed in a low pressure oxygen atmosphere at 1000° C., and thereafter an annealing process (RTA) was performed in a nitrogen atmosphere at 1050° C.

For the seventh sample S6, after the active nitrogen is introduced, a nitridizing and oxidizing annealing process (RTNO) was performed in an NO gas atmosphere at 950° C., and thereafter an annealing process (RTA) was performed in a nitrogen atmosphere at 1050° C. For comparison, two types of samples S8 were formed whose gate insulating films were made of only silicon oxide films.

Figure 3B:
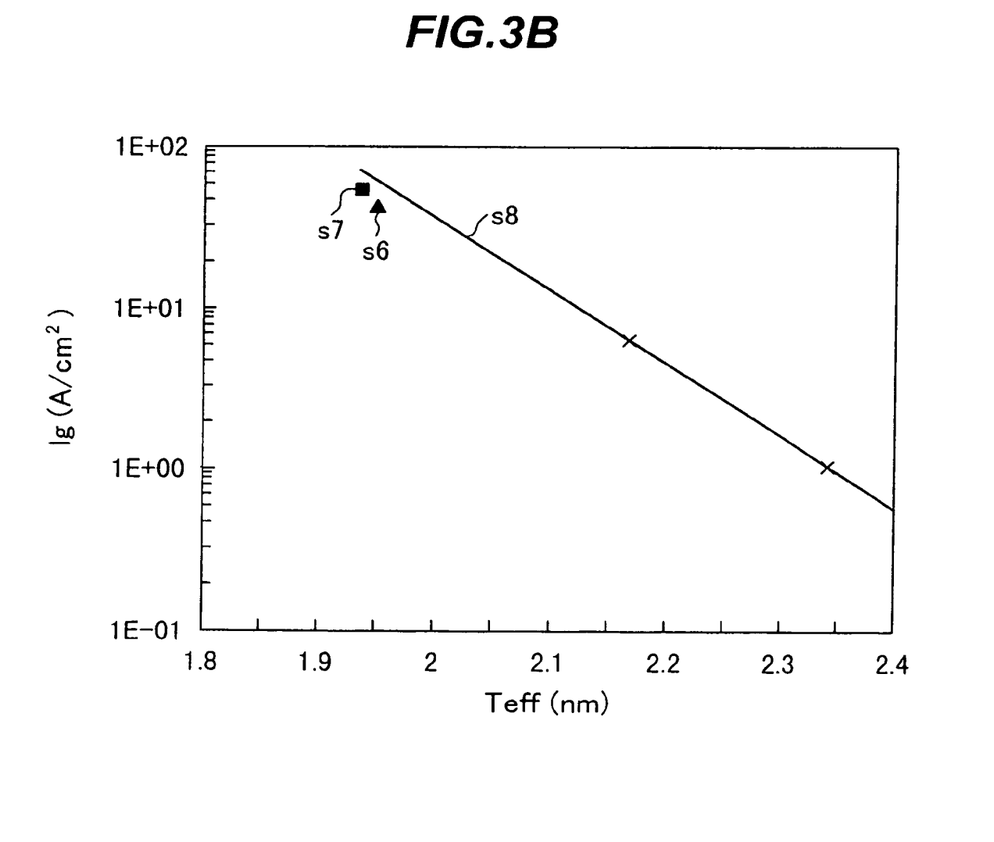

FIG. 3B is a graph showing the measurement results of these samples. The abscissa represents an inversion capacitance equivalent film thickness Teff in the unit of nm, and the ordinate represents a gate leak current in the unit of $A/cm^2$. The characteristics s8 of the samples S8 whose gate insulating films are made of only silicon oxide films are indicated by two points X and represented by a straight line through extrapolation.

The characteristics s6 of the sample S6 position under the characteristics s8 of the comparative sample S8, which means that the gate leak current can be reduced.

The measurement point s7 of the seventh sample S7 was obtained by the nitridizing and oxidizing annealing process in NO so that oxidation is suppressed and the effective gate insulating film thickness is thinner than the measurement point s6. Similar to the sample S6, the characteristics s7 position under the characteristics s8, which means that the gate leak current can be reduced.

In the characteristics shown in FIG. 3B, a reduction degree of the gate leak current is generally the same both for the two samples S6 and S7. The sample S7 thins the effective gate insulating film thickness by 0.013 nm. The mutual conductance Gm is excellent. A saturation current of a MOS transistor having a gate length of 40 nm was improved by 3.6%.

A distribution of nitrogen in a gate insulating film introduced with active region was investigated through two dimensional ion mass spectroscopy (SIMS). DPN was used as the active oxygen introducing system, and the annealing process after active nitrogen introduction was performed in an oxygen atmosphere and in an NO atmosphere.

Figure 4A:
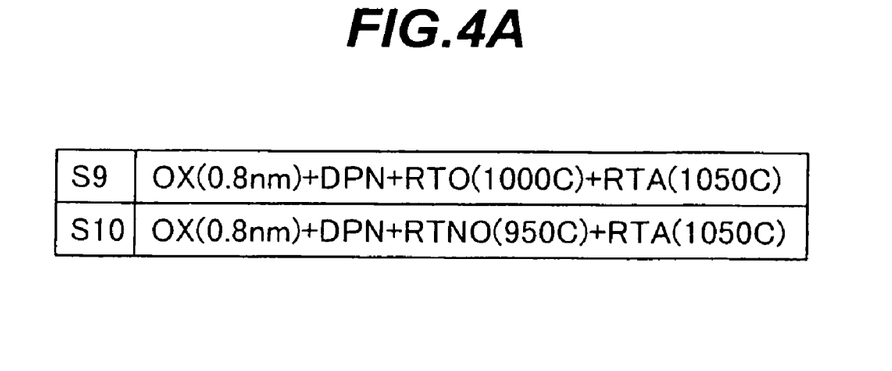
FIGS. 4A and 4B are a table and a graph illustrating the other experiments made by the present inventor and their results.

A table shown in FIG. 4A briefly shows the processes of forming two types of samples. For a ninth sample S9, a silicon oxide film having a thickness of 0.8 nm was formed by using a lamp annealing apparatus in an oxygen atmosphere at 900° C. Thereafter, active nitrogen was introduced (DPN) into the gate oxide film in a room temperature atmosphere, by using decoupled RF nitrogen plasma at 700 W. Thereafter, an annealing process (RTO) was performed in a low pressure oxygen atmosphere at 1000° C., and then an annealing process (RTA) was performed in a nitrogen atmosphere at 1050° C.

For a tenth sample, a silicon oxide film having a thickness of 0.8 nm was formed in a manner similar to the ninth sample S9, and after active nitrogen was introduced by using the DPN system, an annealing process (RTNO) in an NO gas atmosphere at 950° C. was performed and then an annealing process (RTA) was performed in a nitrogen atmosphere at 1050° C.

Figure 4B:
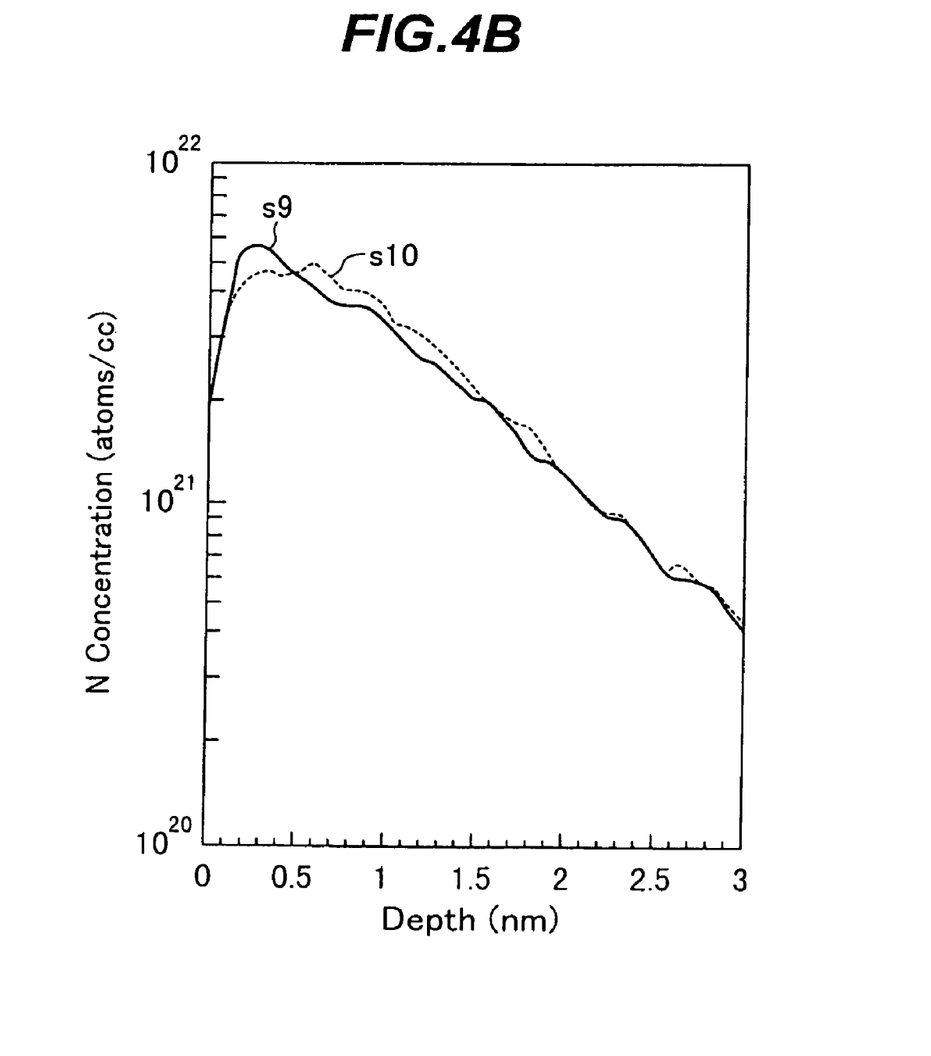

FIG. 4B is a graph showing the measurement results of these two types of the samples. The abscissa represents a depth from the surface in the unit of nm and the ordinate represents a measured nitrogen concentration in the unit of atoms/cc. The characteristics s9 of the sample S9 subjected to the annealing process in the oxygen atmosphere have a high peak value near the surface, and the nitrogen concentration lowers gradually as the depth becomes deeper. In the measurement range, although the nitrogen concentration changes by one digit or larger, the interface between the gate insulating film and silicon substrate positions in this range.

A thickness of the oxynitride film was 1.324 nm, a nitrogen concentration peak was 8.6 at %, and a nitrogen concentration at the interface with the substrate was 3.6 at %. The nitrogen concentration at the interface is one second of or smaller than the peak nitrogen concentration.

The characteristics s10 of the sample S10 subjected to the annealing process in the NO atmosphere after active nitrogen introduction have somewhat a flat and broad peak on the surface side. However, this peak should contain both a nitrogen distribution caused by active nitrogen introduction and a nitrogen distribution caused by the annealing process in the NO atmosphere. After forming the peak, the nitrogen concentration has the tendency that it lowers as the depth becomes deeper while being slightly higher than that of the characteristics s9. From a position having some depth, the nitrogen concentration has the distribution generally the same as that of the characteristics s9.

A thickness of the oxynitride film was 1.174 nm, a nitrogen concentration peak was 7.6 at %, and a nitrogen concentration at the interface with the substrate was 4.9 at %. It is expected that as the thickness of the oxynitride film is increased, the nitrogen concentration at the substrate interface becomes one second of or thinner than the peak nitrogen concentration. The nitrogen concentration at the substrate interface is 5 at % or smaller for both the samples S9 and S10.

Annealing in an oxidizing atmosphere of $O_2$ or the like is expected to be more suitable from the viewpoint that the nitrogen concentration on the surface side is made higher, and the nitrogen concentration at the substrate surface is made lower. However, an increase in the film thickness is larger than annealing in an nitridizing and oxidizing atmosphere. Annealing in a nitridizing and oxidizing atmosphere is expected to be more suitable from the viewpoint that a transistor having an excellent drive capability is formed by suppressing a thickness of the oxynitride film thin.

In both the measurement results, the nitrogen concentration has a peak on the gate insulating film surface side, and lowers toward the interface with the silicon substrate as the depth becomes deeper. It can be understood that the reduction in a mobility of the channel region can be suppressed by suppressing the nitrogen concentration preferably at 5 at % or smaller, in order to introduce a large amount of nitrogen into the gate insulating film and effectively suppress boron piercing.

Experiments were conducted under the conditions that the excitation energy was lowered from 700 W to 500 W, with an expectation that active nitrogen is introduced into the silicon oxide film only near at the surface thereof.

Figure 6A:
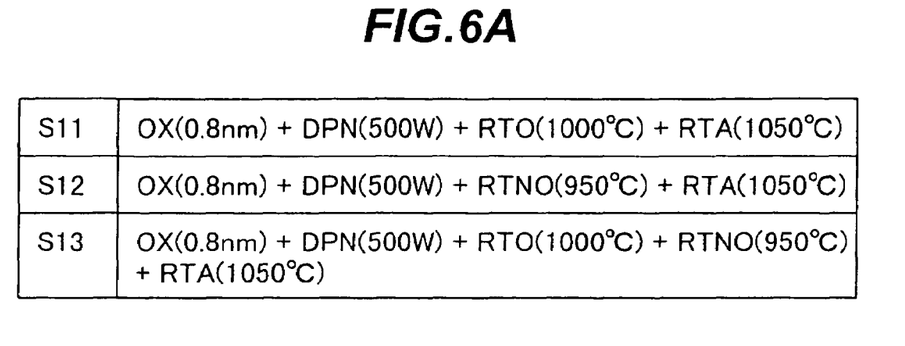
FIGS. 6A and 6B are a table and a graph are cross sectional views and a graph illustrating the other experiments made by the present inventors and their results.

A table shown in FIG. 6A briefly shows a process of forming three types of samples. For an eleventh sample S11, a silicon oxide film having a thickness of 0.8 nm was formed by using a lamp annealing apparatus in an oxygen atmosphere at 900° C. Thereafter, active nitrogen was introduced (DPN)

into the gate oxide film in a room temperature atmosphere, by using decoupled RF nitrogen plasma at 500 W without a bias electric field. Thereafter, an annealing process (RTO) was performed in a low pressure oxygen atmosphere at 1000° C., and then an annealing process (RTA) was performed in a nitrogen atmosphere at 1050° C.

For a twelfth sample S12, similar to the eleventh sample, a silicon oxide film having a thickness of 0.8 nm was formed by using the lamp annealing apparatus in an oxygen atmosphere at 900° C. Thereafter, active nitrogen was introduced (DPN) into the gate oxide film in a room temperature atmosphere, by using decoupled RF nitrogen plasma at 500 W. Thereafter, an annealing process (RTNO) was performed in a low pressure NO atmosphere at 950° C., and then an annealing process (RTA) was performed in a nitrogen atmosphere at 1050° C.

For a thirteenth sample S13, similar to the eleventh sample, a silicon oxide film having a thickness of 0.8 nm was formed by using the lamp annealing apparatus in an oxygen atmosphere at 900° C. Thereafter, active nitrogen was introduced (DPN) into the gate oxide film in a room temperature atmosphere, by using decoupled RF nitrogen plasma at 500 W. Thereafter, an annealing process (RTO) was performed in a low pressure oxygen atmosphere at 1000° C., an annealing process (RTNO) was performed in a low pressure NO atmosphere at 950° C., and then an annealing process (RTA) was performed in a nitrogen atmosphere at 1050° C. After annealing in the NO gas atmosphere, the RTA at a higher temperature is performed to improve the NBTI characteristics, and is not an essential process.

Figure 6B:
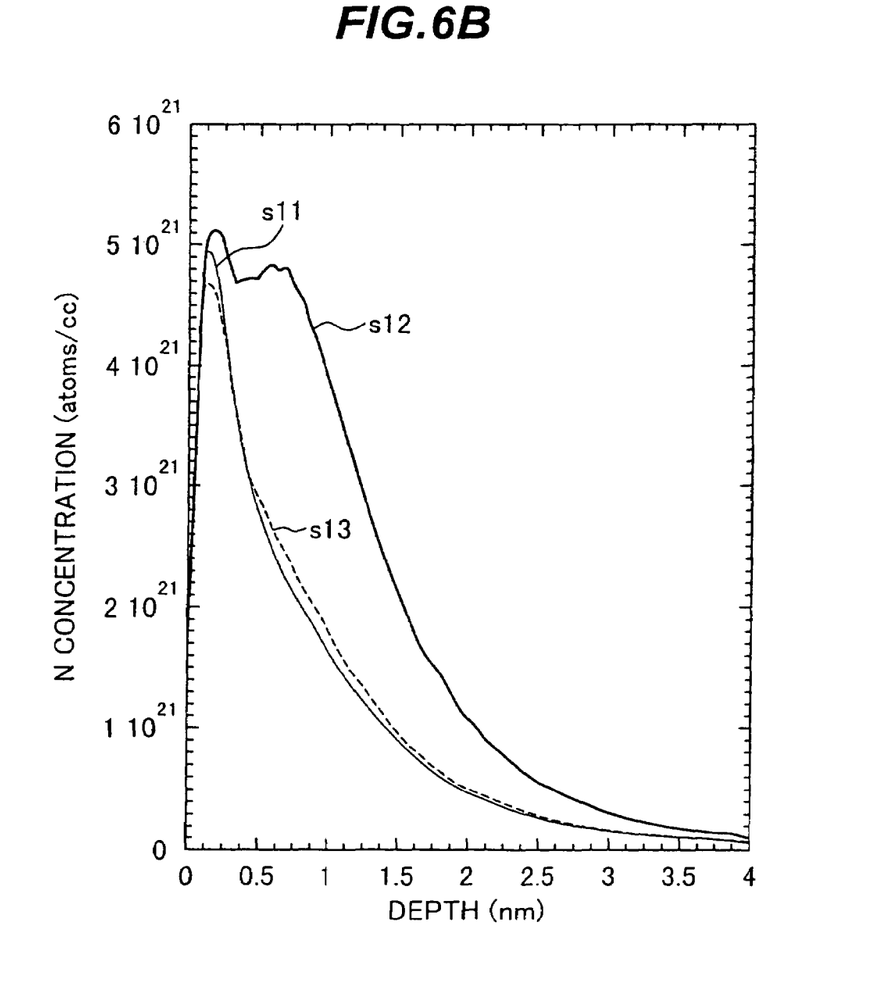

FIG. 6B is a graph showing the measurement results of these three types of the samples. The abscissa represents a depth from the surface in the unit of nm and the ordinate represents a measured nitrogen concentration in the unit of atoms/cc.

The characteristics s11 of the sample S11 subjected to the annealing process in the oxygen atmosphere have a high peak value near the surface, and the nitrogen concentration lowers gradually as the depth becomes deeper. In the measurement range, although the nitrogen concentration changes by one digit or more, the interface between the gate insulating film and silicon substrate positions in this range.

A thickness of the oxynitride film was 1.189 nm, a nitrogen concentration peak was 7.5 at %, and a nitrogen concentration at the interface with the substrate was 2.2 at %. The nitrogen concentration at the interface is one second of or smaller than the peak nitrogen concentration.

The characteristics s12 of the sample S12 subjected to the annealing process in the NO atmosphere after active nitrogen introduction have somewhat a flat and broad peak near the surface. After forming the peak, the nitrogen concentration has the tendency that it lowers as the depth becomes deeper while being slightly higher than that of the characteristics s11. Near the interface, the nitrogen concentration increases, presenting the characteristic distribution having two peaks near the surface and near the interface: The annealing process in the NO atmosphere suggests the tendency that nitrogen is introduced near at the interface with the substrate.

A thickness of the oxynitride film was 1.170 nm, a nitrogen concentration peak was 7.8 at %, and a nitrogen concentration at the interface with the substrate was 4.8 at %.

The characteristics s13 of the sample S13 subjected to the annealing processes in the oxygen atmosphere and in the NO atmosphere after active nitrogen introduction have generally the same peak on the surface side as that of the characteristics s11 of the sample subjected to the oxygen annealing. Although it seems that there is a difference from the characteristics s11, this difference is in a measurement error range of the secondary ion mass spectroscopy (SIMS). The nitrogen concentration increases near at the interface so that it can be confirmed that the interface is nitridized effectively in the NO atmosphere.

A thickness of the oxynitride film was 1.157 nm, a nitrogen concentration peak was 7.4 at %, and a nitrogen concentration at the interface with the substrate was 2.4 at %.

Even if the characteristics are improved by performing the annealing process in the NO atmosphere after active nitrogen introduction, the nitrogen concentration at the interface with the substrate can be suppressed to 5 at % or smaller. By selecting the conditions, it is possible to set the nitrogen concentration at the interface to one second of or smaller than the surface nitrogen concentration. It can be understood from the characteristics s12 and s13 of the samples S12 and S13 that various nitrogen distributions can be realized by controlling the nitrogen distribution to be caused by active nitrogen introduction and the nitrogen distribution to be caused by the annealing process in the NO atmosphere. It is also possible to introduce nitrogen near at the interface by the annealing in the NO atmosphere, without degrading considerably the sharp distribution pattern formed by active nitrogen introduction. It is also easy to realize different nitrogen concentrations at the gate insulating film surface and the interface with the substrate, in accordance with different requirements.

FIGS. 5A to 5D are cross sectional views illustrating a semiconductor manufacture method based upon the above-described experiment results according to an embodiment of the present invention.

Figure 5A:
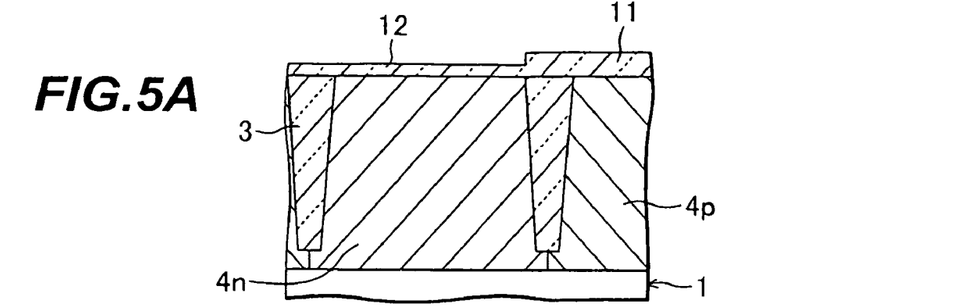
FIGS. 5A to 5D are cross sectional views illustrating a semiconductor device manufacture method according to an embodiment of the present invention.

As shown in FIG. 5A, an element isolation region 3 is formed on a silicon substrate 1 by STI. Predetermined ions are implanted into active regions defined by the STI element isolation region to form an n-type well 4n and a p-type well 4p. A plurality of wells are formed although only two wells are shown.

The exposed silicon substrate surface is subjected to pyrogenic oxidation at 800° C. to form a silicon oxide film 11 having a thickness of 7 nm. Pyrogenic oxidation is an oxidizing method in an atmosphere that hydrogen is burnt in oxygen. The gate oxide film having a thickness of 7 nm is used as a gate insulating film of a MOSFET operating at about 3 V.

In the active region where MOSFET operating at a low voltage is formed, the grown oxide film 11 is removed by etching. Dry oxidation is performed in an oxygen atmosphere at 965° C. to form a silicon oxide film 12 having a thickness of 1.2 nm. The gate oxide film having a thickness of 1.2 nm is used as a gate insulating film of a MOSFET operating at about 1 to 1.2 V. If a natural oxide film exists on the silicon substrate surface, it may be removed in a reducing atmosphere such as hydrogen radical. A silicon oxide film of good quality can be formed by oxidizing a clean silicon surface.

In this example, although gate insulating films having two different thicknesses are formed, gate insulating films having three or more different thicknesses may be formed.

With the latter oxidation, the already formed thick silicon oxide film 11 grows slightly. Both n- and p-type wells are formed also in the wells having the thin gate insulating film.

Figure 5B:
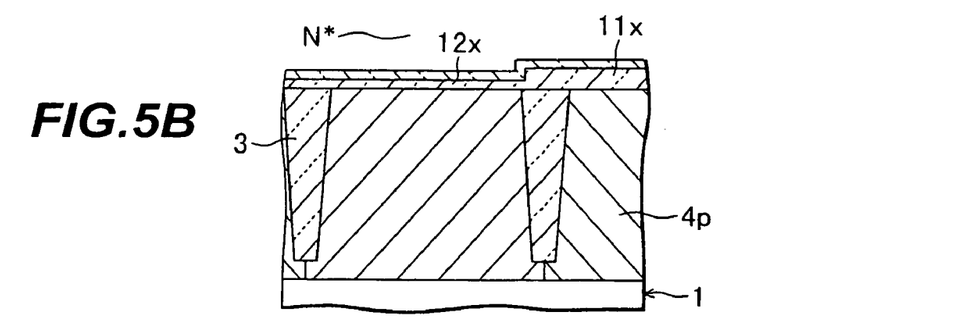

As shown in FIG. 5B, active nitrogen is introduced into the gate insulating films 11 and 12 in an atmosphere at 550° C. by using RPN nitrogen plasma generated by microwaves at 1.5 kW. The active nitrogen introduced gate insulating films become silicon oxynitride films 11x and 12x.

Figure 5C:
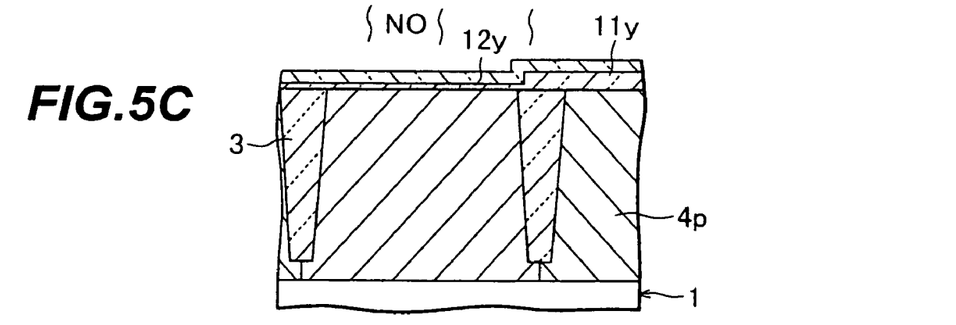

As shown in FIG. 5C, annealing is performed in an NO gas atmosphere at 950° C. NO gas further oxidizes and nitridizes the gate insulating films to remove substrate damages. In this manner, gate insulating films 11y and 12y are formed. In succession, an annealing process may be performed in a nitrogen atmosphere at a high temperature in order to suppress deterioration of the NBTI characteristics or the like.

Thereafter, a polysilicon layer having a thickness of 100 nm is formed on the gate insulating films, and patterned to have desired gate lengths by using a resist pattern. A gate electrode having a gate length of 40 nm is formed on the thin gate insulating film 12y.

Figure 5D:
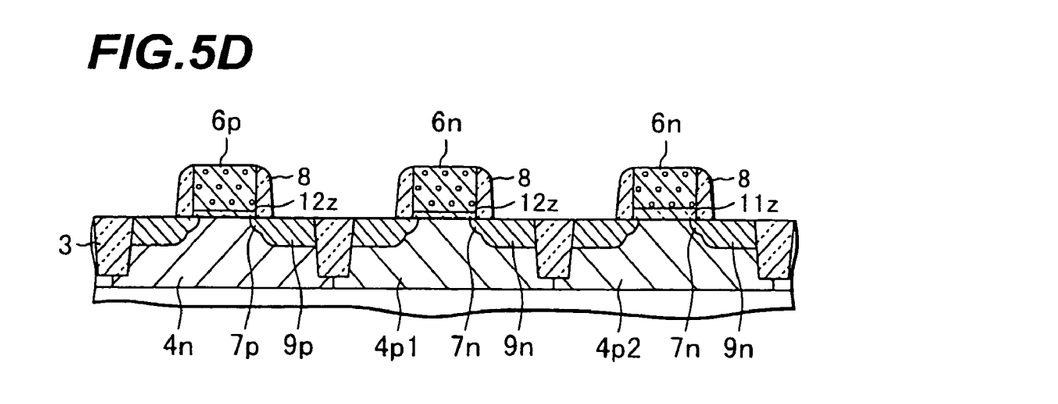

As shown in FIG. 5D, by using as masks, resist masks selecting the patterned gate electrodes and n- and p-channel regions, n- and p-type impurities are implanted to form extension regions 7p and 7n. Thereafter, a silicon oxide film is deposited to a thickness of about 60 nm, and RIE is performed to form side wall spacers 8. By using as masks, resist masks separating the gate electrodes with the side wall spacers and n- and p-channel regions, n- and p-type impurities are implanted to form source/drain regions 9n and 9p Thereafter, if necessary, exposed silicon surfaces are silicidated, and an interlayer insulating film is deposited. Openings are formed through the interlayer insulating film, lead plugs are formed and necessary wiring layers and interlayer insulating films are formed.

In this manner, a CMOS integrated circuit is formed which has thin and thick gate insulating films, can suppress boron from piercing through a thin gate insulating film and can suppress the mobility of a channel region from being lowered.

With the above-described processes, a semiconductor device is formed which has gate insulating films having a thin effective gate insulating film thickness of 2 nm or thinner, particularly 1.7 nm or thinner, can suppress boron piercing and can suppress the mobility of a channel region from being lowered.

According to the above-described embodiment, the nitrogen concentration distribution in the gate insulating film high on the surface side and low at the interface with the silicon substrate is realized so that boron piercing through the gate insulating film can be suppressed and the mobility reduction in the channel region can be suppressed.

The present invention has been described in connection with the preferred embodiments. The invention is not limited only to the above embodiments. For example, the nitridizing and oxidizing annealing in NO may be replaced with annealing in NO diluted with inert gas, in accordance with usage objects. A silicon oxide film as an insulating film initially formed on a semiconductor substrate may be replaced with a silicon oxynitride film which contains nitride at 3 at % or smaller at the interface with the substrate. A high-k material film having a high dielectric constant may be laminated on the silicon oxynitride film.

Figure 7C:
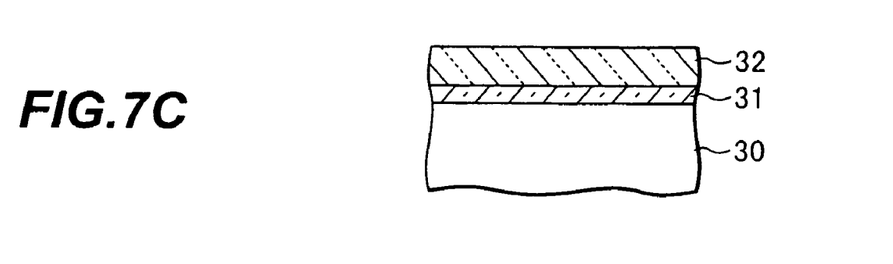

FIG. 7C shows a lamination structure having a high-k (high dielectric constant) material film. High-k material has a much larger dielectric constant than that of silicon oxide. For example, a silicon oxide film having a thickness of 0.58 nm was formed by using the lamp annealing apparatus in an oxygen atmosphere at 750° C. Thereafter, active nitrogen was introduced (DPN) into the gate oxide film in a room temperature atmosphere, by using decoupled RF nitrogen plasma at 500 W. Thereafter, an annealing process (RTNO) was performed in an NO gas atmosphere at 900° C., and an annealing process (RTA) was performed in a nitrogen atmosphere at 1050° C. A thickness of this oxynitride film was 0.80 nm. It is expected that the oxynitride film can be made thinner by adjusting an underlying oxide film thickness, a plasma nitridation intensity, an NO gas annealing temperature, time and the like. On the oxynitride film, a high-k material film 32 such as an oxide film of Al, Hf, Zr or the like and an oxysilicate film of these material is formed so that an excellent gate insulating film can be formed which can prevent a reaction between the semiconductor substrate and high-k material and is excellent in reliability and drive performance. It will be apparent to those skilled in the art that other various modifications, improvements, combinations, and the like can be made.

APPLICABILITY TO INDUSTRIES

The present invention is suitable for the manufacture of micro fine MOS transistors.

I claim:

1. A semiconductor manufacturing method comprising the steps of: forming a gate insulating layer on an active region of a semiconductor substrate;
   introducing nitrogen through a front surface of said gate insulating layer, by using active nitrogen;
   thereafter annealing said semiconductor substrate in NO gas atmosphere; and
   after said annealing step in NO gas atmosphere, annealing the semiconductor substrate in inert gas atmosphere at a higher temperature.

2. The semiconductor manufacturing method according to claim 1, wherein said active nitrogen is radical nitrogen or nitrogen generated from plasma.

3. The semiconductor manufacturing method according to claim 1, wherein an increase in a thickness of said gate insulating layer by said annealing step in NO gas atmosphere is 0.2 nm or thinner.

4. The semiconductor manufacturing method according to claim 1, wherein said annealing step in NO gas atmosphere is executed at a temperature higher than a substrate temperature during said step of introducing nitrogen by using active nitrogen.

5. The semiconductor manufacturing method according to claim 1, wherein said annealing step in NO gas atmosphere is executed in an atmosphere of NO gas diluted with inert gas comprising N2, Ar or He.

6. The semiconductor manufacturing method according to claim 1, further comprising the step of, before said annealing step in NO gas atmosphere, annealing the semiconductor substrate in an oxygen atmosphere or in an atmosphere of oxygen diluted with inert gas.

7. The semiconductor manufacturing method according to claim 1, wherein said gate insulating layer formed on the active region is an insulating layer having a thickness of 1.5 nm or thinner and formed by thermally oxidizing a surface of said semiconductor substrate.

8. The semiconductor manufacturing method according to claim 1, wherein said gate insulating layer is an oxynitride layer containing a small amount of nitrogen which is 3 at % or less at an interface with said semiconductor substrate.

9. The semiconductor manufacturing method according to claim 1, wherein a nitrogen concentration at an interface between said gate insulating layer and said semiconductor substrate is 5 at % or less after said annealing process in NO gas atmosphere.

10. The semiconductor manufacturing method according to claim 1 further comprising the step of, before said step of forming a gate insulating layer on the active region, removing a natural oxide film by subjecting said semiconductor substrate to an annealing process in a reducing atmosphere.

11. The semiconductor manufacturing method according to claim 1, wherein said step of forming a gate insulating layer on the active region of a semiconductor substrate forms insulating layers having different thicknesses on different active regions.

* * * * *